(12) United States Patent
Yoo et al.

(10) Patent No.: US 11,049,995 B2
(45) Date of Patent: Jun. 29, 2021

(54) HIGH-EFFICIENCY LONG-WAVELENGTH LIGHT-EMITTING DEVICE

(71) Applicant: SEOUL VIOSYS CO., LTD., Ansan-si (KR)

(72) Inventors: Hong Jae Yoo, Ansan-si (KR); Hyo Shik Choi, Ansan-si (KR); Hyung Ju Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 16/304,387

(22) PCT Filed: May 23, 2017

(86) PCT No.: PCT/KR2017/005333
§ 371 (c)(1),
(2) Date: Nov. 26, 2018

(87) PCT Pub. No.: WO2017/204522
PCT Pub. Date: Nov. 30, 2017

(65) Prior Publication Data
US 2019/0296187 A1    Sep. 26, 2019

(30) Foreign Application Priority Data

May 26, 2016  (KR) .................... 10-2016-0064824
Mar. 9, 2017  (KR) .................... 10-2017-0029933
May 22, 2017  (KR) .................... 10-2017-0063130

(51) Int. Cl.
*H01L 33/00* (2010.01)
*H01L 33/06* (2010.01)
(Continued)

(52) U.S. Cl.
CPC .......... *H01L 33/06* (2013.01); *H01L 33/0075* (2013.01); *H01L 33/145* (2013.01); *H01L 33/325* (2013.01)

(58) Field of Classification Search
CPC ... H01L 33/007; H01L 33/0075; H01L 33/04; H01L 33/06; H01L 33/12; H01L 33/14;
(Continued)

(56) References Cited

U.S. PATENT DOCUMENTS 7,646,009 B2 * 1/2010 Kozaki ................. B82Y 20/00
257/14
2007/0096077 A1  5/2007 Sanga
(Continued)

FOREIGN PATENT DOCUMENTS

JP    2002-223042      8/2002
JP    2004297098 A *  10/2004 ............. H01S 5/343
(Continued)

OTHER PUBLICATIONS

International Search Report dated Aug. 8, 2017 in International Patent Application No. PCT/KR2017/005333, 3 pages.

*Primary Examiner* — Natalia A Gondarenko

(57) ABSTRACT

A long-wavelength light emitting device is disclosed. The long-wavelength light emitting device comprises: a first conductive semi-conductor layer; an active layer that is located on the first conductive semi-conductor layer and that has a quantum well structure; and a second conductive semi-conductor layer that is located on the active layer. The active layer comprises: one or more well layers including a nitride-based semi-conductor having 21% or more In; two barrier layers located in upper and lower parts of the well layers, and located between the well layers and the barrier layers, wherein the upper capping layers have a bigger band-gap energy relative to the barrier layers, and the upper capping layers and the well layers are in contact.

20 Claims, 9 Drawing Sheets

(51) Int. Cl.
*H01L 33/14* (2010.01)
*H01L 33/32* (2010.01)

(58) Field of Classification Search
CPC ....... H01L 33/145; H01L 33/18; H01L 33/26; H01L 33/285; H01L 21/02458; H01L 21/0254; H01L 33/30; H01L 33/305; H01L 33/32; H01L 33/325; H01L 2933/0016; H01L 2933/0033; H01L 2933/0058; H01L 2933/0066; H01L 31/0352; H01L 31/035209; H01L 31/035236; H01L 2924/202; H01L 2924/2024
USPC ........ 257/13–15, 79, 94, 96–97, 98, 99, 106
See application file for complete search history.

(56) References Cited

U.S. PATENT DOCUMENTS

| | | | | |
|---|---|---|---|---|
| 2011/0187294 | A1* | 8/2011 | Bergmann | H01L 33/04 315/363 |
| 2011/0227039 | A1* | 9/2011 | Moon | B82Y 20/00 257/13 |
| 2012/0298955 | A1* | 11/2012 | Emerson | H01L 21/0237 257/13 |
| 2013/0146842 | A1* | 6/2013 | Kim | H01L 33/06 257/13 |
| 2014/0191192 | A1* | 7/2014 | Han | H01L 33/0025 257/13 |
| 2015/0214422 | A1* | 7/2015 | Kim | H01L 33/145 257/13 |
| 2015/0280056 | A1* | 10/2015 | Northrup | H01L 33/0025 257/13 |
| 2016/0126410 | A1* | 5/2016 | Debray | H01L 33/145 257/13 |
| 2017/0213936 | A1* | 7/2017 | Nagata | H01L 33/0025 |

FOREIGN PATENT DOCUMENTS

| | | |
|---|---|---|
| KR | 10-2011-0091246 | 8/2011 |
| KR | 10-2013-0007169 | 1/2013 |
| KR | 10-2016-0022032 | 2/2016 |
| KR | 10-2016-0022750 | 3/2016 |

* cited by examiner

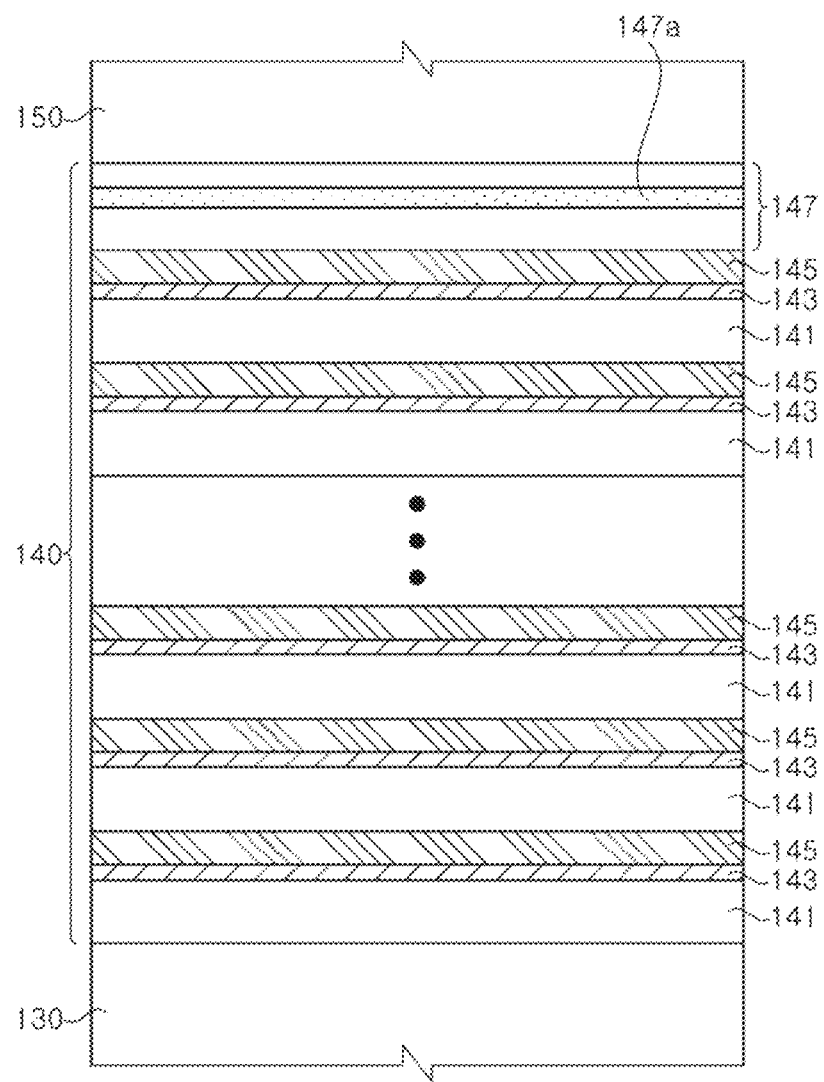

(a)

(b)

HIGH-EFFICIENCY LONG-WAVELENGTH LIGHT-EMITTING DEVICE

CROSS-REFERENCE TO RELATED APPLICATIONS

This patent document claims priority to and the benefit of International Patent Application No. PCT/KR2017/005333 filed on May 23, 2017 which claims priorities to Korean Patent Application Nos. 10-2016-0064824, filed on May 26, 2016 and 10-2017-0029933, filed on Mar. 9, 2017, and 10-2017-0063130, filed on May 22, 2017, which are all hereby incorporated by reference for all purposes as if fully set forth herein.

TECHNICAL FIELD

The present disclosure relates to a light-emitting device, and particularly to a high-efficiency light-emitting device emitting long-wavelength light including green light.

BACKGROUND ART

Recently, nitride based semiconductors have been widely used as base materials for light emitting devices such as light emitting diodes. Nitride based semiconductors may have various band gap energies depending on the composition ratio of group III elements, and thus, light of various wavelength bands can be obtained by controlling the composition ratio of elements such as Al, Ga, In.

A multiple quantum well structure (MQW) is commonly used as a structure of an active layer, and an emission wavelength of the light-emitting device is determined by the composition ratio of the nitride-based semiconductor in well layers of the MQW. For example, an InGaN layer containing a small amount of In is used for the well layer of a light emitting element emitting blue light from the active layer, and an AlGaN layer is used for the well layer of the ultraviolet light emitting device.

Meanwhile, in order to obtain a light-emitting device which emits relatively longer wavelength light, that is, a light-emitting device with a longer wavelength than blue light, a nitride-based semiconductor containing a large amount of In is used to form the well layer. However, it is difficult to directly apply general methods of manufacturing a blue light-emitting device into the manufacture of long-wavelength light-emitting devices because nitride-based semiconductors containing excessive In, such as InGaN, are different from GaN in growth conditions.

Further, it is known that a light emitting diode with a well layer containing excessive In is generally vulnerable to electrostatic discharge, compared to a blue light emitting diode.

DISCLOSURE

Technical Problem

A problem to be solved by the present disclosure is to provide a long wavelength light emitting device having high efficiency and minimized wavelength shift by preventing precipitation and segregation due to separation of In atoms from In sites in a well layer.

Another problem to be solved by the present disclosure is to provide a long wavelength light emitting device having high luminous efficiency while preventing occurrence of a device failure due to electrostatic discharge.

Technical Solution

In accordance with one exemplary embodiment of the present disclosure, a long wavelength light emitting device comprises: a first conductivity type semiconductor layer; an active layer disposed over the first conductivity type semiconductor layer, the active layer having a quantum well structure; and a second conductivity type semiconductor layer disposed over the active layer, wherein the active layer comprises: at least one well layer comprising a nitride-based semiconductor containing more than or equal to 21% of In; at least two barrier layers disposed upper and under the well layer; and at least one upper capping layer disposed over the well layer between the well layer and the barrier layer, wherein the upper capping layer has a band gap energy greater than the barrier layer, wherein the upper capping layer and the well layer are in contact with each other.

Meanwhile, the well layer may comprise InGaN, the barrier layer may comprise GaN, and the upper capping layer may comprise AlGaN.

In addition, AlGaN of the upper capping layer may comprise 0.1% to 2.5% of Al. More specifically, AlGaN of the upper capping layer may comprise 1.4% to 1.8% of Al, and high-quality light output and low forward voltage may be achieved within this range.

Meanwhile, a thickness of the upper capping layer may be smaller than that of the barrier layer. In one embodiment, the upper capping layer may have a thickness of 5 Å to 20 Å.

Meanwhile, the long wavelength light emitting device comprises a plurality of well layers and a plurality of barrier layers, and a thickness of an uppermost barrier layer disposed at an uppermost part among the plurality of barrier layers may be greater than thicknesses of remaining barrier layers.

In addition, the uppermost barrier layer may comprise a sub barrier layer with a smaller band gap energy than an average band gap energy of the uppermost barrier layer. In particular, the sub barrier layer may include In, and In composition ratio of a sub barrier layer may be smaller than In composition ratio of a well layer. A sub-barrier layer has a smaller lattice constant than a well layer, and thus, a lattice mismatch between a well layer and an electron blocking layer is reduced. Thereby, a crystalline quality of a second conductivity type semiconductor layer may be improved.

The long wavelength light emitting device may further comprise at least one lower capping layer disposed under the well layer between the well layer and the barrier layer, wherein the lower capping layer may have a band gap energy greater than that of the barrier layer.

The long wavelength light emitting device may further comprise an electron blocking layer disposed over the active layer.

In some embodiments, the electron blocking layer may comprise a grading layer in which an Al composition ratio decreases toward the second conductivity type semiconductor layer. By using the Al grading layer, the electron blocking layer can block electrons and holes can be easily injected into the active layer. In addition, the electron blocking layer may contain In, and an In composition ratio of the electron blocking layer may be smaller than an In composition ratio of the sub barrier layer. Thus, In composition ratios and the lattice constants gradually decrease in the order of the well layer, the sub barrier layer, and the electron blocking layer. By gradually reducing an In composition ratio in a long wavelength light emitting device containing a very large In composition ratio as described above, a crystalline quality of an electron blocking layer and a second conductivity type semiconductor layer may be improved. By improving a crystalline quality of a second conductivity type semiconductor layer and an electron blocking layer, it is possible to provide a light emitting device resistant to electrostatic discharge.

In another embodiment, the electron blocking layer comprises a first electron blocking layer in contact with the active layer, a second electron blocking layer disposed over the first electron blocking layer, and a third electron blocking layer in contact with the second conductivity type semiconductor layer, wherein the second electron blocking layer is doped with Mg at a higher concentration than the first and third electron blocking layers, and the third electron blocking layer may have a superlattice structure. Thus, by using the second electron blocking layer, the blocking layer can efficiently block electrons and holes can be well injected into the active layer.

Furthermore, the third electron blocking layer may have a superlattice structure of AlInGaN/GaN. By adopting the AlInGaN/GaN superlattice structure, it is possible to improve crystalline quality of the second conductivity type semiconductor layer, for example, a GaN layer, formed on the structure.

Meanwhile, the barrier layer may have a thickness of 120 Å to 150 Å, but is not limited thereto. The barrier layer may have a thickness greater than 150 Å. However, the barrier layer has a thickness of 220 Å or less. If the barrier layer is thicker than 220 Å, the light output decreases and the forward voltage increases. In particular, the barrier layer may have a thickness of 170 Å to 200 Å, and high light output and low forward voltage are possible within this thickness range.

Meanwhile, the active layer comprises a plurality of barrier layers and a plurality of well layers, wherein the plurality of barrier layers comprises barrier layers doped with a relatively high concentration of an n-type impurity and barrier layers doped with n-type impurity at a relatively low concentration or un-doped with the n-type impurity among the barrier layers. The barrier layers doped with the n-type impurity at a relatively high concentration are disposed closer to the first conductivity type semiconductor layer than the second conductivity type semiconductor layer. Electrons and holes are generally easy to recombine in a well layer close to a second conductivity type semiconductor layer. Thus, injection efficiency of electrons may be improved while preventing the non-radiative recombination by doping an n-type impurity in the barrier layers relatively close to the first conductivity type semiconductor layer compared to the barrier layers adjacent to the well layers where electrons and holes are recombined.

In addition, the barrier layers may comprise Mg-doped barrier layers and wherein the Mg-doped barrier layers may have a higher Mg doping concentration as being closer to the second conductivity type semiconductor layer. Hole injection efficiency can be improved by doping Mg at a relatively high concentration in the barrier layers close to the second conductivity type semiconductor layer.

Meanwhile, the first conductivity type semiconductor layer may comprise a V-pit generating layer. The V-pit generating layer may comprise a first layer of a single composition doped with an n-type impurity and a second layer of a superlattice structure. A light-emitting device resistant to electrostatic discharge may be provided by forming a V-pit passing through an active layer by using the V-pit generating layer.

Furthermore, the first layer is a GaN layer doped with an n-type impurity, and the second layer may have an InGaN/GaN superlattice structure. By making the second layer as a superlattice structure, crystalline quality of the active layer may be improved. In content of InGaN in the superlattice structure may be 1% to 5%.

In addition, the V-pit generating layer has a thickness of 1500 Å to 3000 Å, and the thickness of the second layer of the superlattice structure may be greater than or equal to that of the first layer of the single composition. By setting the thickness of the second layer to be greater than or equal to the thickness of the first layer, it is possible to provide a light-emitting device resistant to electrostatic discharge while securing the crystalline quality of the active layer.

Meanwhile, the first conductivity type semiconductor layer may further comprise a modulation doped layer with an n-type impurity disposed under the V-pit generating layer, and a doping concentration of the modulation doped layer with n-type impurity is higher than an n type impurity doping concentration of the first layer. The modulation doped layer with the n-type impurity may become a contact layer where an electrode is in contact.

In some embodiments, the second layer may be doped with an n-type impurity at a higher concentration than that of the first layer. However, in another embodiment, the second layer may be doped with an n-type impurity at a lower concentration than that of the first layer or may not be doped.

Meanwhile, the active layer comprises a plurality of barrier layers and a plurality of well layers, wherein the plurality of barrier layers comprise barrier layers doped with a relatively high concentration of an n-type impurity and barrier layers doped with n-type impurity at a relatively low concentration or un-doped with an n-type impurity among the barrier layers, the barrier layers doped with the n-type impurity at a relatively high concentration are disposed closer to the first conductivity type semiconductor layer than the second conductivity type semiconductor layer, and have higher doping concentration of an n-type impurity than the first layer, and wherein the first layer has a higher doping concentration than the barrier layers with a relatively low concentration of an n-type impurity or un-doped with n-type impurity.

In one embodiment, the light emitting device may comprise V-pits having entrances exceeding 250 nm.

In another embodiment, the second conductivity type semiconductor layer may comprise a p-AlGaN layer disposed between the p-GaN layers. The p-AlGaN layer may be disposed closer to a lower surface of the second conductivity type semiconductor layer than an upper surface of the second conductivity type semiconductor layer, and wherein the lower surface is disposed closer to the active layer than the upper surface.

Effects of the Disclosure

According to the present disclosure, there is provided a long wavelength light emitting device comprising an upper capping layer covering a well layer and disposed between a well layer and a barrier layer. The upper capping layer prevents thermal damage of the well layer, and thus it prevents separation of In and prevents the deterioration of crystallinity of the well layer. In addition, since the upper capping layer has a lattice constant smaller than those of the well layer and the barrier layer, strain generated in the well layer can be reduced, thus the Stark effect of quantum confinement can be reduced, and the luminous efficiency can be improved.

In addition, a device failure due to electrostatic discharge can be prevented by disposing a V-fit generating layer under an active layer.

Other features and advantages of the present disclosure will become clearer with following detailed descriptions.

BRIEF DESCRIPTION OF DRAWINGS

FIGS. 5A and 5B are an enlarged cross-sectional view and a band diagram illustrating an active layer of a long wavelength light emitting device according to one exemplary embodiment of the present disclosure.

MODE FOR CARRYING OUT THE DISCLOSURE

Figure 1:
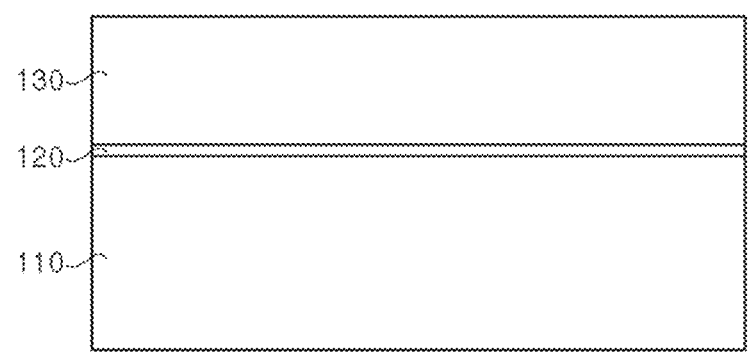
FIGS. 1, 2, 3, and 4 are cross-sectional views illustrating a long wavelength light emitting device according to exemplary embodiments of the present disclosure and a method of manufacturing the long wavelength light emitting device.

Hereinafter, exemplary embodiments of the present disclosure will be described in detail with reference to the accompanying drawings. The following exemplary embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In addition, in the drawings, widths, lengths, thicknesses, and the like of elements may be exaggerated for clarity and descriptive purposes. Also, it will be understood that, when an element is referred to as being "disposed over" or "disposed on" another element, it can be directly "disposed over" or "disposed on" the other element, or intervening elements may be present. Throughout the specification, like numerals denote like elements.

In addition, each composition ratio, growth methods, growth conditions, thicknesses, and the like of nitride-based semiconductor layers described below are illustrative, and the present disclosure is not limited as described below. For example, in the case where it is written as InGaN, the composition ratio of In and Ga may be variously applied to the necessity of those who have normal knowledge in this art (hereinafter. "those skilled in the art"). In addition, a nitride-based semiconductor layers described below may be grown by using various methods commonly known to those skilled in the art, for example, by methods of MOCVD (Metal Organic Chemical Vapor Deposition), MBE (Molecular Beam Epitaxy) or HVPE (Hydride Vapor Phase Epitaxy), or the like. However, in exemplary embodiments described below, it is described that semiconductor layers are grown in a growth chamber using MOCVD. In growth processes of nitride-based semiconductor layers, for sources flowing into a growth chamber, unless specifically mentioned, sources known to those skilled in the art may be used, for example, TMGa, TEGa, and the like may be used as a Ga source, and TMAl, TEAl, and the like may be used as an Al source, and TMIn, TEIn, and the like may be used as an In source, and NH 3 may be used as an N source. However, the present disclosure is not limited to these. In addition, for methods of manufacturing a long wavelength light emitting device according to exemplary embodiments described later, a sequence of respective steps corresponds to an example, and the sequence of respective steps can be changed.

FIG. 1 to FIG. 4 are cross-sectional views illustrating a long wavelength light emitting device according to exemplary embodiments of the present disclosure and methods of manufacturing the long wavelength light emitting device.

First of all, referring to FIG. 1, a first conductivity type semiconductor layer 130 is formed on a substrate 110. In an exemplary embodiment, a buffer layer may be further formed on the substrate 110 before growing the first conductivity type semiconductor layer 130.

The substrate 110 is not limited as long as it is a substrate on which a nitride-based semiconductor can be grown, for example, it may comprise a heterogeneous substrate such as a sapphire substrate, a silicon substrate, a silicon carbide substrate, and a spinel substrate, and may also comprise a homogeneous substrate such as a gallium nitride substrate and an aluminum nitride substrate. In addition, the substrate 110 may have a nonpolar, a semi-polar, or a polar growth surface.

The first conductivity type semiconductor layer 130 is disposed on the growth substrate 110. The first conductivity type semiconductor layer 130 may comprise a nitride-based semiconductor such as (Al, Ga, In) N, and may be grown and formed on the growth substrate 110 by using methods of MOCVD, MBE, HVPE, or the like. For example, when the MOCVD is used to grow the first conductivity type semiconductor layer 130, by growing a nitride-based semiconductor layer containing GaN at a growth temperature of about 950 to 1200° C. at a predetermined growth rate, the first conductivity type semiconductor layer 130 may be formed. In addition, the first conductivity type semiconductor layer 120 may be doped with an n-type comprising one or more impurities such as Si, C, Ge, Sn, Te, Pb, or the like. However, it is not limited thereto, and the first conductivity type semiconductor layer 130 may be doped with an opposite conductivity type comprising a p-type dopant. Furthermore, the first conductivity type semiconductor layer 130 may be formed of a single layer or a multi layer. In the case where the first conductivity type semiconductor layer 130 is composed of a multi layer, the first conductivity type semiconductor layer 130 may comprise a superlattice layer, a contact layer, a modulation doped layer, an electron injection layer, and the like. For the case where the first conductivity type semiconductor layer 130 is a multi layer, it will be described later in more detail with reference to FIG. 7.

Meanwhile, before growing the first conductivity type semiconductor layer 130, a buffer layer 120 can be further formed on the substrate 110. The buffer layer 120 may comprise a nitride semiconductor such as GaN, and may be grown using MOCVD, and may be grown at a growth temperature in the range of about 450 to 600° C. The buffer layer 120 may improve crystallinity of a semiconductor layer growing on the substrate 110 in a subsequent process, and it may also act as a seed layer on which a nitride-based semiconductor layer can be grown on a heterogeneous substrate.

Figure 2:
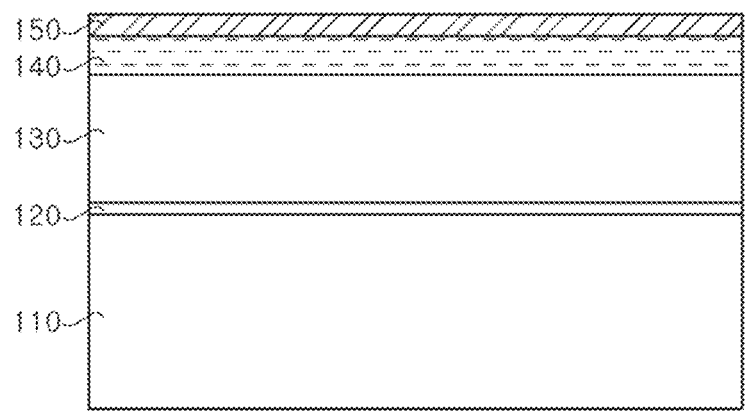

Referring to FIG. 2, an active layer 140 is formed on the first conductivity type semiconductor layer 130. Furthermore, an electron blocking layer 150 may be further formed on the active layer 140.

The active layer 140 may comprise a nitride semiconductor such as (Al, Ga, In) N, and may grow on the first conductivity type semiconductor layer 130 using a method such as MOCVD. MBE, HVPE, or the like. In addition, the active layer 140 may comprise a quantum well structure (QW) comprising at least two barrier layers 141 and at least one well layer 143, further, it may comprise a multiple quantum well structure (MQW) comprising a plurality of barrier layers 141 and a plurality of well layers 143. In addition, the active layer 140 may further comprise an upper capping layer 145 or 145$a$ disposed on at least one well layer 143 and between the at least one well layer 143 and the barrier layer 141. Furthermore, the active layer 140 may further comprise a lower capping layer 145$b$ disposed under at least one well layer 143 and between the at least one well layer 143 and the barrier layer 141.

Light emitted from the active layer 140 may be relatively long wavelength light, for example, green light of a longer wavelength band than that of blue light may be emitted. The wavelength of light emitted from the active layer 140 may be adjusted by controlling the composition ratio of a nitride-based semiconductor layer of the well layer 143. In this case, the well layer 143 may comprise a nitride-based semiconductor containing In, and wherein the composition ratio of In may be 21% or more. In relation to the active layer 140, it will be described later in more detail.

The electron blocking layer 150 is located on the active layer 140 and prevents electrons from overflowing upward from the active layer 140. The electron blocking layer 150 may be formed on an uppermost barrier layer 147 of the active layer 140. In addition, an average band gap energy of the electron blocking layer 150 may be greater than an average band gap energy of the uppermost barrier layer 147, thereby electrons' movement toward a second conductivity type semiconductor layer 160 may be blocked by an energy barrier of the electron blocking layer 150.

Figure 3:
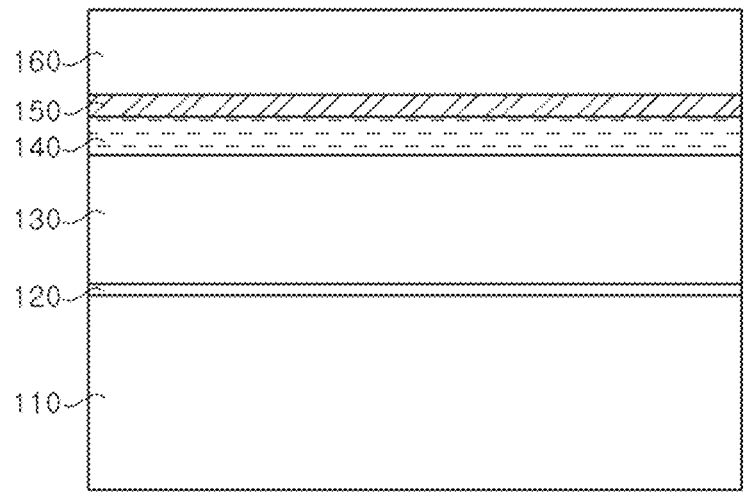

Referring to FIG. 3, the second conductivity semiconductor layer 160 is formed on the active layer 140 or the electron blocking layer 150.

The second conductivity type semiconductor layer 160 may comprise a nitride-based semiconductor such as (Al, Ga, In) N, and may be grown using a method such as MOCVD, MBE, or HVPE. The second conductivity type semiconductor layer 160 may be doped with a conductivity type opposite to that of the first conductivity type semiconductor layer 130. For example, the second conductivity type semiconductor layer 160 may be doped with a p-type comprising an impurity such as Mg. The second conductivity type semiconductor layer 160 may be formed of a p-GaN single layer, but it is not limited thereto, and may comprise a AlGaN layer inside. The second conductivity type semiconductor layer 160 may have a doping profile where Mg doping concentration is the highest at a surface of the second conductivity type semiconductor layer 160, relatively high on a side of the electron blocking layer 150, and relatively low at an inner layer. Further, the Mg doping profile may comprise a region where the doping concentration is relatively increased and then decreased between the inner layer region having the relatively low doping concentration and the electron blocking layer 150. An AlGaN layer disposed inside the second conductivity type semiconductor layer 160 may be arranged in a region having a profile with a relatively low Mg doping concentration and in a resign where the doping concentration decreases between the inner layer region having the relatively low doping concentration and the electron blocking layers 150.

Figure 4:
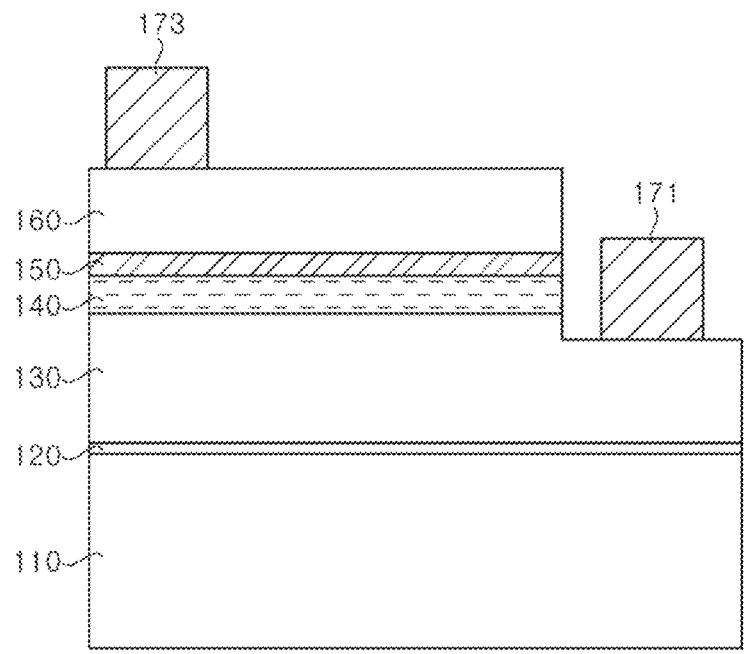

A structure of FIG. 3 may be changed in various ways, and thereby long wavelength light emitting devices of various structures may be implemented. Referring to FIG. 4, for example, the long wavelength light emitting device may further comprise a first electrode 171 and a second electrode 173, thus a lateral type light emitting device may be provided. The first electrode 171 and the second electrode 173 are electrically connected to the first conductivity type semiconductor layer 130 and the second conductivity type semiconductor layer 160, respectively. However, the present disclosure is not limited thereto, and the structure of FIG. 3 can be transformed into various structures such as a flip-chip type light emitting device, a vertical type light emitting device, and the like. In addition, the substrate 110 may be omitted in accordance with a structure of a light emitting device.

Hereinafter, the active layer 140 of a long wavelength light emitting device according to various exemplary embodiments will be described in more detail with reference to FIG. 5A to FIG. 6B.

Figure 5B:
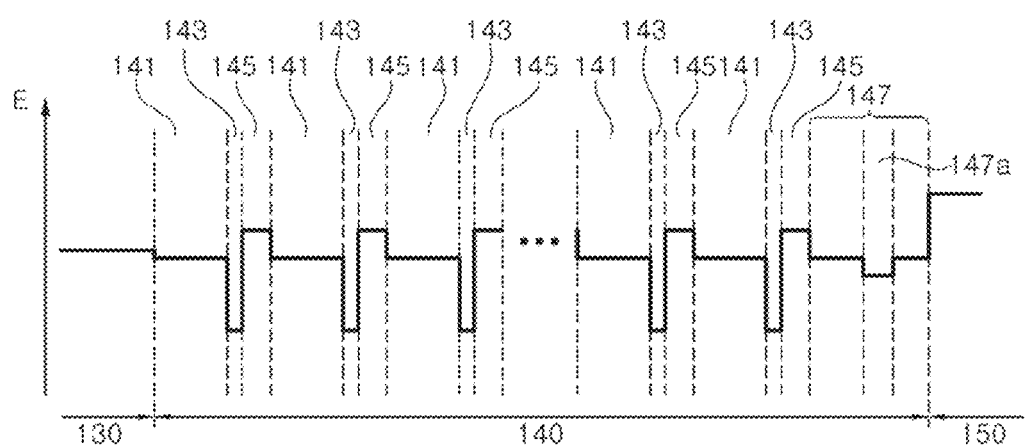

First, FIG. 5A and FIG. 5B are an enlarged cross-sectional view and a band diagram illustrating the active layer 140 of a long wavelength light emitting device according to an exemplary embodiment.

Referring to FIG. 5A and FIG. 5B, the active layer 140 may comprise at least one well layer 143, at least two barrier layers 141, and at least one upper capping layer 145. In addition, the active layer 140 may comprise a plurality of well layers 143, a plurality of barrier layers 141 disposed on and under each of the well layers 143, and a plurality of upper capping layers 145 disposed on each of the well layers 143. Furthermore, the active layer 140 may comprise the uppermost barrier layer 147 forming a last barrier layer of the active layer 140.

The well layer 143 is disposed between the barrier layers 141, and the band gap energy of the well layer 143 is smaller than that of the barrier layer 141 as shown in FIG. 5B. The well layer 143 may comprise or be formed of $In_xGa_{(1-x)}N$ (0<x<1), and a composition ratio (x) of In may be controlled corresponding to a wavelength emitted from the long wavelength light emitting device. In an exemplary embodiment, a composition ratio (x) of In may be 0.21 or more, and further may be 0.23 or more. Thus, the long wavelength light emitting device may emit green light. The barrier layer 141 may comprise GaN and/or InGaN. Since a band gap energy of the barrier layer 141 is larger than that of the well layer 143, an In composition ratio of InGaN of the barrier layer 141 is smaller than an In composition ratio (x) of $In_xGa_{(1-x)}N$ of the well layer 143 in the case where the barrier layer 141 comprises InGaN.

The upper capping layer 145 is disposed on the well layer 143, and it is disposed between the well layer 143 and the barrier layer 141. In particular, the upper capping layer 145 may contact the well layer 143 disposed under the layer. An average lattice constant of the upper capping layer 145 may be smaller than those of the well layer 143 and the barrier layer 141. In addition, a bandgap energy of the upper capping layer 145 may be larger than that of the barrier layer 141. In an exemplary embodiment, the upper capping layer 145 may comprise or be formed of $Al_yGa_{(1-y)}N$ (0<y<1), and the composition ratio (y) of Al may be 0.001 to 0.025. Additionally, when the composition ratio (y) of Al is in the range of 0.014 to 0.017, high-quality light output and low forward voltage may be achieved.

Hereinafter, a manufacturing process of the active layer 140 will be described.

First, the barrier layer 141 may be formed on the first conductivity type semiconductor layer 130. The barrier layer 141 may be formed of GaN and may be grown to a thickness of about 120 Å to 220 Å, more specifically, to a thickness of 170 Å to 200 Å, at a temperature of about 900 to 1200° C. High light output and low forward voltage may be achieved in this range of thicknesses of the barrier layer 141. Next, the well layer 143 is formed on the barrier layer 141. The well layer 143 may be formed of $In_xGa_{(1-x)}N$ and may be formed to a thickness of about 20 Å to about 30 Å. A growth temperature of the well layer 143 may be set to about 150° C. to 200° C. lower than that of the barrier layer 141. If the well layer 143 is grown at an extremely high temperature, an In content in the well layer 143 may be formed lower than intended, thus the well layer 143 of the long wavelength light emitting device requiring a relatively high In composition ratio is grown at within the temperature range mentioned above. Subsequently, the upper capping layer 145 is formed on the well layer 143. The upper capping layer 145 may grow approximately at the same temperature as the growth temperature of the well layer 143. For example, the upper capping layer 145 may be formed of $Al_yGa_{(1-y)}N$ growing at the growth temperature of about 150° C. to 200° C. lower than that of the barrier layer 141. The upper capping layer 145 may have a thickness of about 5 Å to 20 Å. After that, a growth temperature is raised again and growth processes of the barrier layer 141, the well layer 143, and the upper capping layer 145 are repeated, thus a structure of the active layer 140 illustrated in FIG. 5A may be provided.

Generally, if a growth temperature is raised in a state that a surface of the well layer 143 is exposed after the growth of the well layer 143, a probability that In atoms in the well layer 143 escape from sites of a semiconductor layer is increased. If it goes like this, In may precipitate or In segregation may occur on the surface of the well layer 143 as a growth temperature rises. In this case, the crystalline quality of the well layer 143 becomes bad or surface morphology deteriorates. In addition, if In atoms are released from sites of a semiconductor layer, In composition ratio of the well layer 143 becomes smaller than intended, and light having a shorter wavelength than intended one is emitted from a light emitting device. However, according to the exemplary embodiments described above, the barrier layer 141 is not formed by raising a temperature immediately after the growth of the well layer 143 is completed, and the barrier layer 141 is formed after forming the upper capping layer 145 grown at almost the same temperature as the growth temperature of the well layer 143. As a result, the upper capping layer 145 covers an upper portion of the well layer 143 and may protect the well layer 143 from heat. Therefore, it may prevent In atoms from being detached from the well layer 143, and thereby it may prevent deterioration of the surface morphology of the well layer 143 and shift phenomenon into a short wavelength. In addition, by forming the upper capping layer 145, a growth temperature of the barrier layer 141 may be raised to a temperature at which the crystalline quality of the barrier layer 141 may be improved, and thus entire crystalline quality of the active layer 140 may be improved, and luminous efficiency of the light emitting device may be improved.

Meanwhile, since the upper capping layer 145 is formed of $Al_yGa_{(1-y)}N$ grown at a relatively low temperature, the crystalline quality of the upper capping layer 145 itself may not be relatively good. However, since a thickness of the upper capping layer 145 is controlled to be about 5 Å to 20 Å, it is very thin compared to that of the barrier layer 141, thus deterioration of a crystalline quality of the entire active layer 140 by the upper capping layer 145 hardly occurs. Therefore, the decline of luminous efficiency due to the crystalline quality of the upper capping layer 145 hardly occurs either.

In addition, generally, a long wavelength light emitting device such as a green light emitting device has a relatively strong stress and strain due to the difference in lattice constants between a well layer and a barrier layer due to a high In content of a well layer. As a result, a strong Quantum Confined Stark Effect (QCSE) occurs, thus resulting in a decrease in luminous efficiency and a change in emission wavelength. However, according to exemplary embodiments, by forming the upper capping layer 145 having a smaller average lattice constant than those of the barrier layer 141 and the well layer 143 between the barrier layer 141 and the well layer 143, the strain of the well layer 143 is reduced. Since Quantum Confined Stark Effect (QCSE) in the well layer 143 weakens due to the reduced strain, thus a luminous efficiency may be improved and a change in an emission wavelength due to a band bending may be reduced.

Further, according to exemplary embodiments, by setting a thickness of the upper capping layer 145 to be about 5 Å to 20 Å and a thickness of the barrier layer 141 to be about 120 Å to 220 Å, especially 170 Å to 200 Å, a luminous efficiency may be optimized. By forming the upper capping layer 145 within the thickness range described above, a strain due to a difference in lattice constants may be minimized, and deterioration of the crystalline quality caused by the upper capping layer 145 may be minimized. In addition, by having the thickness of the barrier layer 141 within the range mentioned above in consideration of the thickness of the upper capping layer 145, an average crystallinity of the entire active layer 140 may be improved, and thus a light emission efficiency may be improved.

Referring again to FIG. 5A and FIG. 5B, among barrier layers, the uppermost barrier layer 147 disposed directly under the electron blocking layer 150 may be thicker than the average thickness of the remaining barrier layers 141. In addition, the uppermost barrier layer 147 may comprise a sub barrier layer 147a having a band gap energy smaller than the average band gap energy of the uppermost barrier layer 147.

Meanwhile, in some exemplary embodiments, a light emitting device may have a multiple quantum well structure having a plurality of barrier layers 141 and a plurality of well layers 143 alternately stacked. In this case, since mobility of electrons is higher than that of holes, electrons and holes generally recombine in the well layer 143 close to the second conductivity type semiconductor layer 160 (or electron blocking layer 150). Therefore, by doping an n-type impurity such as Si in the barrier layers 141 in the active layer 140 portion where the recombination of electrons and holes does not occur well, that is, in the barrier layers 141 close to the first conductivity type semiconductor layer 130, it is possible to improve an injection efficiency of electrons, whereby a forward voltage of the light emitting device may be lowered. In this case, the plurality of barrier layers 141 may comprise barrier layers doped with a relatively high concentration of an n-type impurity and barrier layers doped with n-type impurity at a relatively low concentration or un-doped with an n-type impurity. In particular, the barrier layers 141 doped with a relatively high concentration of n-type impurity are arranged closer to the first conductivity type semiconductor layer 130 than the second conductivity type semiconductor layer 160.

In general, it is desirable that a periphery of at least two well layers 143 close to the second conductivity type semiconductor layer 160 is not doped with an n-type impurity such as Si. For example, if there are ten of the barrier layers 141, five barrier layers 141 close to the first conductivity type semiconductor layer 130 may be doped at a relatively high concentration, for example, with Si at about $5 \times 10^{18}$/cm$^2$, and five barrier layers close to the second conductivity type semiconductor layer 160 may be doped at a relatively low concentration, for example, with Si at about $5 \times 10^{17}$/cm$^2$. Also, it is not necessary for Si-doped barrier layers 141 to have the same Si doping concentrations, and the doping concentration may gradually decrease as the barrier layer 141 is farther away from the first conductivity type semiconductor layer 130.

Figure 7:
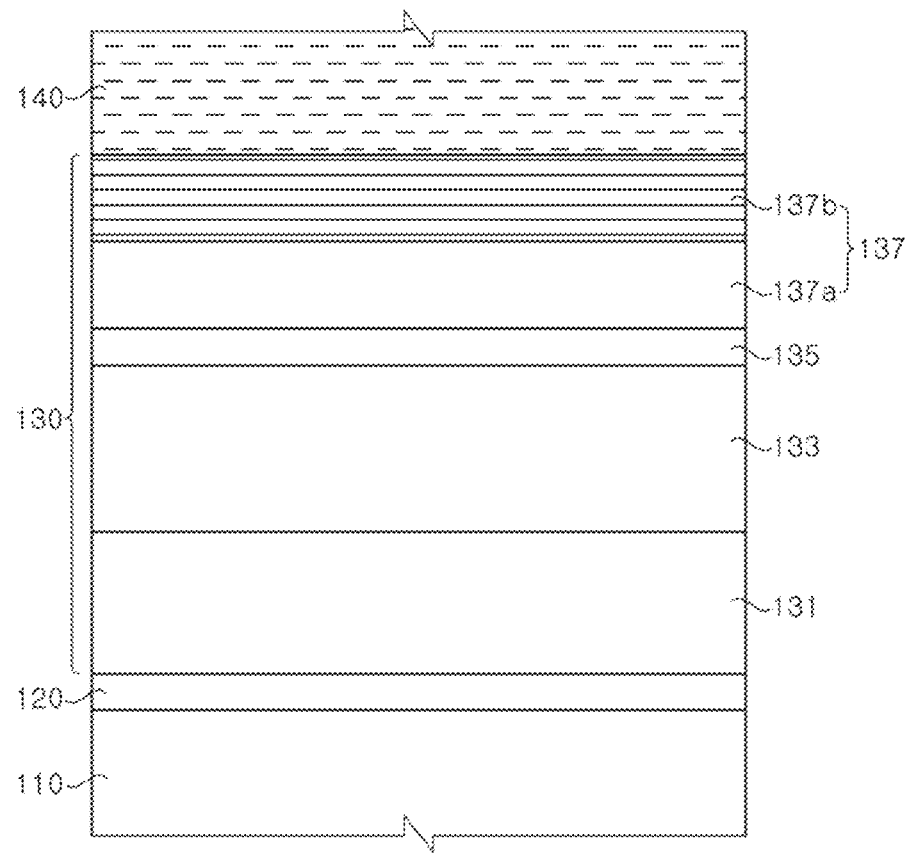
FIG. 7 is an enlarged cross-sectional view illustrating a first conductivity type semiconductor layer of a long wavelength light emitting device according to an exemplary embodiment of the present disclosure.

Meanwhile, an n-type impurity doping concentration of the barrier layers 141 doped with n-type impurity at a relatively high concentration is lower than a doping concentration of n-type impurity doped in a modulation doped layer 133 in FIG. 7 on the first conductivity type semiconductor layer 130, but higher than a doping concentration of the n-type impurity in a V-pit generating layer 137 in FIG. 7. This will be described again later.

Meanwhile, the barrier layer 141 may be doped with a p-type impurity such as Mg. A p-type impurity may be doped to improve a hole injection efficiency, thus it is generally doped in barrier layers close to the second conductivity type semiconductor layer 160. Further, the closer to the second conductivity type semiconductor layer 160 it is, the more Mg may be doped. However, a doping concentration of Mg doped in barrier layers is relatively lower than that of Mg doped in the electron blocking layer 150 or the second conductivity type semiconductor layer 160.

Figure 6A:
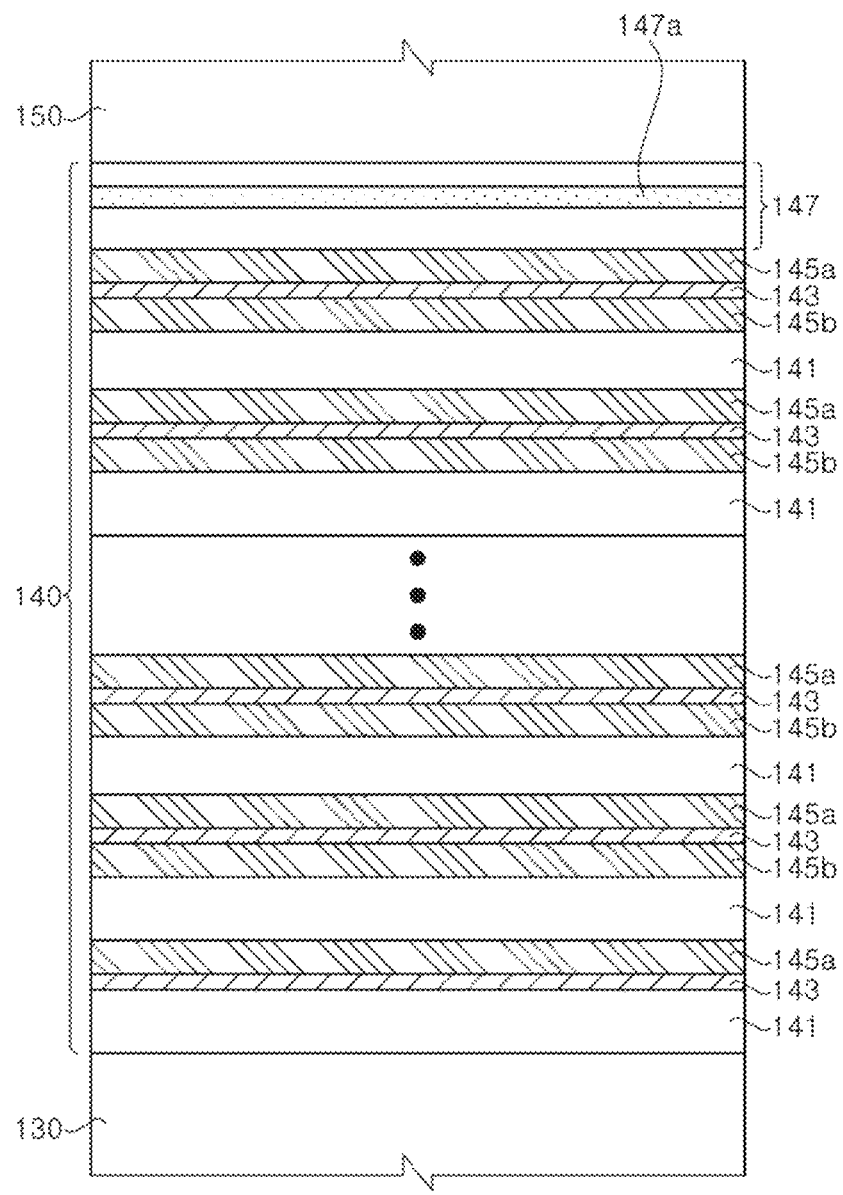
FIGS. 6A and 6B are an enlarged cross-sectional view and a band diagram illustrating an active layer of a long wavelength light emitting device according to another exemplary embodiment of the present disclosure.
Figure 6B:
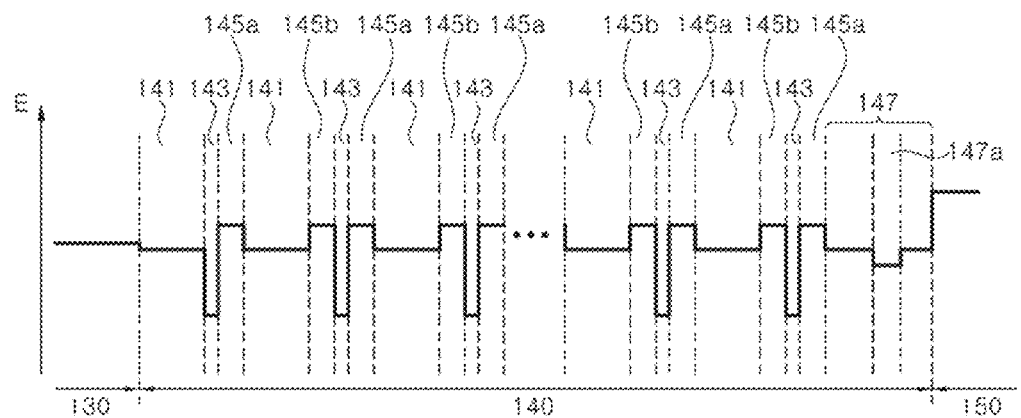

In addition, in various exemplary embodiments, as shown in FIG. 6A and FIG. 6B, the active layer 140 may comprise the upper capping layer 145a and may further comprise the lower capping layer 145b.

Referring to FIG. 6A and FIG. 6B, the lower capping layer 145b is disposed under the well layer 143, and is disposed between the well layer 143 and the barrier layer 141. In particular, the lower capping layer 145b may contact the well layer 143 disposed thereon. An average lattice constant of the lower capping layer 145b may be smaller than average lattice constants of the well layer 143 and the barrier layer 141. Further, a band gap energy of the lower capping layer 145b may be larger than that of the barrier layer 141. In an exemplary embodiment, the lower capping layer 145b may comprise or be formed of $Al_zGa_{(1-z)}N$ (0<z<1) and a composition ratio (z) of Al may be 0.001 to 0.025. The upper capping layer 145a and the lower capping layer 145b may comprise or be formed of AlGaN having approximately the same Al composition ratio. However, the present disclosure is not limited thereto, and an Al composition ratio of the upper capping layer 145a may be different from an Al composition ratio of the lower capping layer 145b. By further comprising a lower capping layer 145b, a strain of the well layer 143 may be further reduced.

FIG. 7 is an enlarged cross-sectional view illustrating the first conductivity type semiconductor layer 130 of the long wavelength light emitting device according to an exemplary embodiment of the present disclosure.

Referring to FIG. 7, the first conductivity type semiconductor layer 130 is disposed on the substrate 110. If the substrate 110 is a heterogeneous substrate such as a sapphire substrate (including a patterned sapphire substrate), a buffer layer 120 can be formed on the substrate 110 first.

The first conductivity type semiconductor layer 130 may comprise, for example, an un-doped semiconductor layer 131, the modulation doped layer 133, a strain relief layer 135, and the V-pit generating layer 137. The V-pit generating layer 137 may comprise a first layer 137a of a single composition and a second layer 137b of a superlattice structure.

An un-doped semiconductor layer 131 may be formed of GaN, and it is desirable that Si is not doped in order to improve crystalline quality. However, a semiconductor layer doped with Si at low concentration may be used in other exemplary embodiments.

The modulation doped layer 133 may be formed of GaN, and is modulation-doped with an n type impurity such as Si. Therefore, a region doped with an n-type impurity and an un-doped region, or a region doped with a relatively high concentration of an n-type impurity and a region doped with a relatively low concentration of an n-type impurity are alternately repeated. An impurity concentration, for example, a Si doping concentration in the region doped with the n-type impurity or the region doped with the n-type impurity at the relatively high concentration is higher than a doping concentration of an n-type impurity in the barrier layers 141. The modulation doped layer 133 is in contact with an n-electrode 171 and the region doped with the n-type impurity or the region doped with the n-type impurity at the relatively high concentration may be doped with Si at a relatively high concentration, for example, $5 \times 10^{18}$/cm$^3$ or more, further, $1 \times 10^{19}$/cm$^3$ or more in order to lower a contact resistance and spread currents. In addition, for a stable ohmic contact, the region doped with the n-type impurity or the region doped with the n-type impurity at the relatively high concentration is thicker than the un-doped region or the region doped with the n-type impurity at a relatively low concentration.

The strain relief layer 135 may be formed to relieve a strain applied to the active layer 140 and to aid current spreading. The strain relief layer 135 may be formed of a superlattice layer, for example. AlGaN layers doped with n-type impurity and un-doped GaN layers being alternately stacked, for instance, five pairs of n-AlGaN/u-GaN superlattice layer. A doping concentration of the n-type impurity, for example, Si doped in n-AlGaN is approximately similar to a doping concentration of Si doped in the modulation doped layer 133, and, for instance, may be $5 \times 10^{18}$/cm$^3$ or more, further, $1 \times 10^{19}$/cm$^3$ or more. However, the strain relief layer 135 can be omitted.

The V-pit generating layer 137 creates a V-fit in a portion where threading dislocations are formed. The V-pit generating layer 137 may be formed by using TEGa (Triethyl Gallium) as a Ga source in a temperature range of 750° C. to 950° C., specifically 800° C. to 900° C., more specifically 800° C. to 850° C. and by using $N_2$ carrier gas. Under this condition, V-pits of generally uniform size are generated.

V-pits are formed through the active layer 140. A breakdown voltage inside a V-pit shows difference from a breakdown voltage of an active region surrounding the V-pit and accordingly, currents can be spread owing to v-pits during electrostatic discharge, thus a breakdown of an active region may be prevented.

In the present exemplary embodiment, the V-pit generating layer 137 comprises a first layer 137a of a single composition and a second layer 137b of a superlattice structure. The first layer 137 may be formed of a GaN layer doped with an n-type impurity, for example Si. A doping concentration of an n-type impurity in the first layer 137 is lower than a Si doping concentration of the modulation doped layer 133, and further may be lower than a doping concentration of an n-type impurity in the barrier layers 141 doped with n-type impurity at a high concentration.

Meanwhile, the second layer may be formed of, for example, an InGaN/GaN superlattice structure. The second layer may not be doped with an n-type impurity or may be doped. However, a doping concentration of an n-type impurity in the second layer is lower than a Si doping concentration of the modulation doped layer 133, and further lower than a doping concentration of an n-type impurity in the barrier layers 141 doped with an n type impurity at a high concentration. The active layer 140 may be formed directly on the second layer, and therefore by forming the second layer 137b with a superlattice structure containing InGaN, the crystalline quality of the active layer 140 may be improved. An In composition ratio of an InGaN layer in a second layer may be 1% to 5%.

Meanwhile, a thickness of the V-pit generating layer 137 affects a light output and a forward voltage of a light emitting diode. A thickness of the V-pit generating layer 137 may range, for example, from 1500 Å to 3000 Å. In this range, it is possible to achieve light output of 90% or more of a maximum light output. More specifically, a thickness of the V-pit generating layer 137 may be in the range of, for example, 2000 Å to 3000 Å, in this range, it is possible to achieve light output of 95% or more of a maximum light output and a relatively low forward voltage.

In this case, the second layer 137b has a thickness equal to or greater than that of the first layer 137a. By securing the second layer 137b at least as thick as the first layer 137a, V-pits within the limited thickness range may be formed and the crystalline quality of the active layer 140 may be improved. In particular, the second layer 137b may have a thickness of 1000 Å or more.

Figure 8:
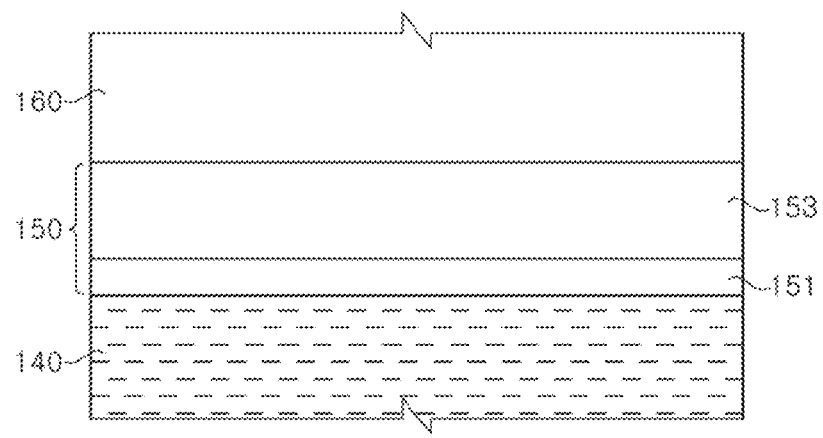
FIG. 8 is an enlarged cross-sectional view illustrating an electron blocking layer of a long wavelength light emitting device according to an embodiment of the present disclosure.

FIG. 8 is an enlarged cross-sectional view illustrating an electron blocking layer 150 of a long wavelength light emitting device according to an exemplary embodiment of the present disclosure.

Referring to FIG. 8, the electron blocking layer 150 may comprise a grading layer 153 having an Al composition ratio decreasing toward the second conductivity type semiconductor layer 160. Furthermore, the electron blocking layer 150 may further comprise an interfacial layer 151 of a single composition between the grading layer 153 and the active layer 140.

The electron blocking layer 150 may be formed of AlGaN or AlInGaN and has a relatively high band gap, thus blocks movement of electrons from the active layer 140 to the second conductivity type semiconductor layer 160, thus improves a luminous efficiency. The electron blocking layer 150 must block the flow of electrons and allow holes to be injected into a region of the active layer 140. The In composition ratio in a sub barrier layer 147 is smaller than that in the well layer 143, and an In composition ratio in the electron block layer 150 is lower than that in the sub barrier layer 147. Accordingly, by decreasing an In content in the order of the well layer 143, the sub barrier layer 147, and the electron blocking layer 150, a lattice mismatch between the well layer 143 and the electron blocking may be decreased and preferable electron blocking layer 150 and second conductivity type semiconductor layer 160 may be grown.

An Al composition ratio of the grading layer 153 may gradually decrease from an Al composition ratio of the interfacial layer 151, and finally an Al composition ratio may become 0. Since the Al composition in the grading layer 153 decreases toward the second conductivity type semiconductor layer 160, an energy barrier decreases toward the second conductivity type semiconductor layer 160. As a result, holes may be better injected into the active layer 140 beyond the grading layer 153.

In addition, a p-type impurity such as Mg may be doped in the electron blocking layer 150 and the electron blocking layer 150 may show a doping concentration grading characteristic that a doping concentration decreases toward the active layer 140 in the electron blocking layer 150. A doping concentration grading may be formed in the grading layer 153 or in the interfacial layer 151.

In the present exemplary embodiment, it is described that the interfacial layer 151 having a certain thickness is formed before forming the grading layer 153, but the interfacial layer 151 may be omitted.

Figure 9:
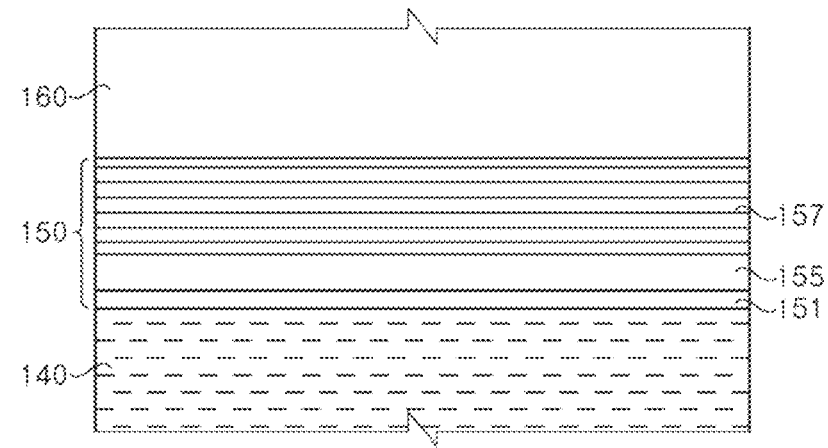
FIG. 9 is an enlarged cross-sectional view illustrating an electron blocking layer of a long wavelength light emitting device according to another exemplary embodiment of the present disclosure.

FIG. 9 is an enlarged cross-sectional view illustrating an electron blocking layer 150 of a long wavelength light emitting device according to another exemplary embodiment of the present disclosure.

Referring to FIG. 9, the electron blocking layer 150 may comprise a first electron blocking layer 151, a second electron blocking layer 155, and a third electron blocking layer 157.

The first electron blocking layer 151 may be formed of a single composition equal to the interfacial layer 151 described above with reference to FIG. 8, and contacts the active layer 140. The first electron blocking layer 151 may be formed of AlGaN or AlInGaN. A p-type impurity such as Mg may be doped in the first electron blocking layer 151. A doping concentration of a p-type impurity in the first electron blocking layer 151 may be lower than that of a p-type impurity in the second conductivity type semiconductor layer 160. Additionally, a doping concentration of a p-type impurity in the first electron blocking layer 151 may have a grading characteristic decreasing toward the active layer 140.

The second electron blocking layer 155 may be formed of AlGaN or AlInGaN having a lower Al composition ratio than the first electron blocking layer 151. Furthermore, the second electron blocking layer 155 may have a single composition, or a superlattice structure. The second electron blocking layer 155 is doped with a p-type impurity at a higher concentration than those of the first and the third electron blocking layers 151 and 157. A doping concentration of a p-type impurity, for example Mg, doped in the second electron blocking layer 155 may be approximately similar to a concentration of a p-type impurity in the second conductivity type semiconductor layer 160.

The third electron blocking layer 157 is in contact with the second conductivity type semiconductor layer 160. The third electron blocking layer 157 may have a superlattice structure to improve the crystalline quality of the second conductivity type semiconductor layer 160. For example, the third electron blocking layer 157 may have a superlattice structure of AlInGaN/GaN. The third electron blocking layer 157 may also be doped with a p-type impurity such as Mg and a doping concentration may be lower than that of a p-type impurity in the second conductivity type semiconductor layer 160, and, it may also be lower than a doping concentration of the first electron blocking layer 151.

In this exemplary embodiment, the second electron blocking layer 155 is disposed between the first electron blocking layer 151 and the third electron blocking layer 157 and has a relatively low band gap compared to the first and third electron blocking layers 151 and 157. In addition, the second electron blocking layer 155 is doped with a p-type impurity at a high concentration. As a result, holes may be easily injected into the active layer 140 from the second conductivity type semiconductor layer 160 through the electron blocking layer 150.

Figure 10:
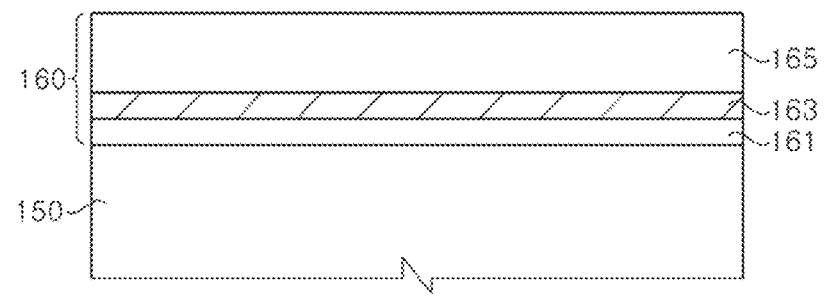
FIG. 10 is an enlarged cross-sectional view illustrating a second conductivity type semiconductor layer of a long wavelength light emitting device according to an exemplary embodiment of the present disclosure.

FIG. 10 is an enlarged cross-sectional view illustrating a second conductivity type semiconductor layer of a long wavelength light emitting device according to an exemplary embodiment of the present disclosure.

Referring to FIG. 10, the second conductivity type semiconductor layer 160 may comprise a first layer 161, a second layer 163, and a third layer 165. The second conductivity type semiconductor layer 160 may be formed of a single layer of a single composition p-GaN, but the one formed of a plurality of layers will be described in the exemplary embodiment.

The first layer 161 is in contact with the electron blocking layer 150. The first layer 161 is grown in an $N_2$ atmosphere and is formed along with V-pits. The first layer 161 is formed of p-GaN. The Mg doping concentration of the first layer 161 is lower than the doping concentration of the electron blocking layer 160, but relatively higher than that of the second layer 163.

The second layer 163 is disposed on the first layer 161 and is formed of p-AlGaN. An Mg doping concentration of the second layer 163 is lower than that of the first layer 161. An AlGaN layer is generally grown at a relatively high temperature as compared to the GaN layer, but there is a limit to raise the growth temperature since the second conductivity type semiconductor layer 160 is grown over the active layer 140. Therefore, lowering an Mg doping concentration of the second layer 163 than that of the first layer prevents a crystalline quality from deteriorating.

The second layer 163 may be arranged as a p-AlGaN single layer in the second conductivity type semiconductor layer 160, but it is not limited thereto, and a plurality of p-AlGaN layers may be arranged with interposing layers of GaN. Here, the Al composition ratio of AlGaN may be 10% or less, more specifically, 5% or less. Even if a content of Al content increases up to 5%, increase in a driving voltage is seldom occurred, but when it exceeds 5%, a driving voltage increases. In particular, when a content of Al exceeds 10%, the injection of holes is excessively disturbed, and a driving voltage of a light emitting device is greatly increased.

The second layer 163 is grown in an $H_2$ atmosphere and fills a V-pit. The size of a V-pit becomes extremely large while a V-pit starts growing from the V-pit generating layer 137 and grows through the active layer 140 containing excessive In. In addition, since the electron blocking layer 150 and the first layer 161 are grown in an $N_2$ atmosphere, they don't fill V-pits. Before growing the second layer 163, a V-pit may be formed to be about 200 nm or more in depth. Since the growth rate of the AlGaN layer 163 grown in an $H_2$ atmosphere is relatively slow, it may fill a relatively large V-pit.

The third layer 165 is a layer disposed at a side of the upper surface of the second conductivity type semiconductor layer 160. The third layer 165 may be formed of p-GaN. The third layer 163 may have a Mg doping concentration region having a higher concentration than the electron blocking layer 150 at a surface side thereof, a Mg doping concentration region having a relatively higher concentration than the doping concentration of the second layer 163 but lower than the doping concentration of the first layer 161 at a side of the second layer 163, and a Mg doping concentration region having a lower concentration than the doping concentration of the second layer 163 inside. The heavily doped region at the surface of the third layer 165 is for Ohmic contact. The region having the concentration lower than the doping concentration of the second layer 163 is for uniformly dispersing holes into the plane of the second conductivity type semiconductor layer 160, but it can be omitted.

In this exemplary embodiment, the second layer 163 is disposed closer to the electron blocking layer 150 than the upper surface of the second conductivity type semiconductor layer 160. As a result, the V-pit can be filled immediately during the growth of the second conductivity type semiconductor layer 160, and the third layer 165 in the flat region may be made relatively thick.

In this exemplary embodiment, it was explained that the AlGaN layer 163 is used to fill V-pits, however, V-pits may be left behind on a surface of a light emitting device by growing the AlGaN layer 163 in the $N_2$ atmosphere or omitting it.

Figure 11:
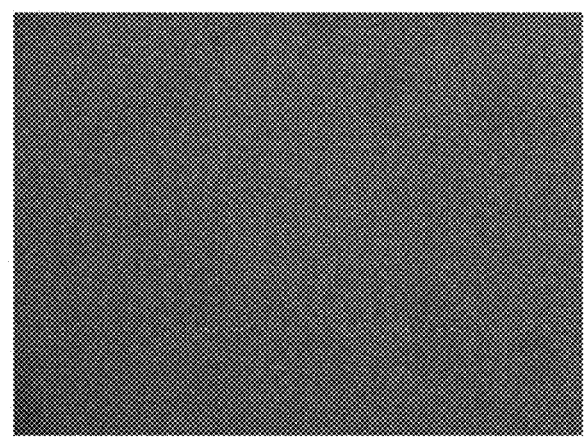
FIG. 11 is optical images showing surfaces of a light emitting device according to various embodiments of the present disclosure.
Figure 11:
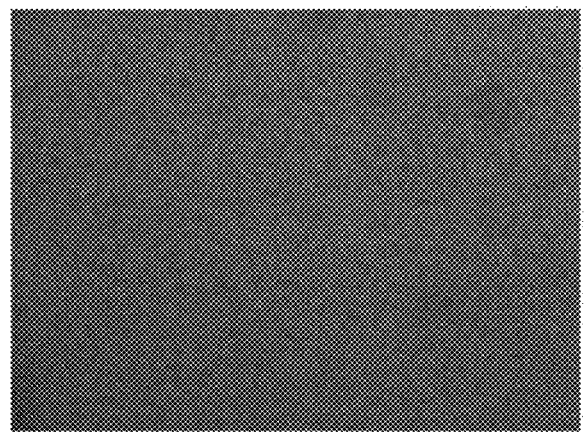
Figure 12:
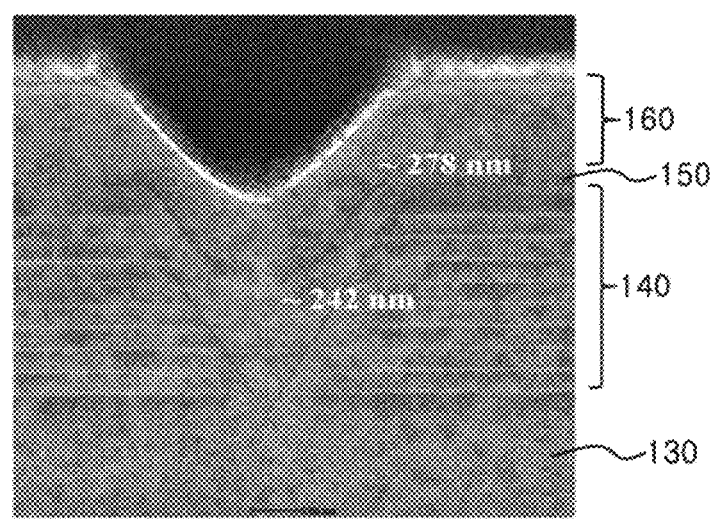
FIG. 12 is an electron microscope image showing the cross-sectional image of a V-pit.

FIG. 11A is an optical image showing a flattened surface of a light-emitting device by filling up V-pits according to the exemplary embodiment of FIG. 10, and FIG. 11B is an optical image showing a surface of a light emitting device having V-pits left. FIG. 12 is an electron microscope image showing a cross-sectional view of a V-pit in FIG. 11b.

As shown in FIG. 11A, a surface may become flat by filling V-pits with the AlGaN layer 163 described previously, or it may be maintained as shown in FIG. 11B.

By not using a layer filling V-pits, it is possible to form a large amount of V-pits having widths of entrances exceeding about 250 nm from the long wavelength light emitting device. Further, depths of V-pits may be larger than entire thicknesses of the second conductivity type semiconductor layer 160 and the electron blocking layer 150. A density of a V-pit, for example, may range from $1\times10^4$ to $1\times10^7/cm^3$. Remaining V-pits on a surface of a light-emitting device reduce internal total reflection and maximize light extraction efficiency. Further, since V-pits increase a surface area of the second conductivity type semiconductor layer 160, an area for an electrode formation is increased, and thus the driving voltage may be lowered.

Conventionally, a roughened surface is formed on a surface by intentional etching, but it is difficult to form a roughened surface at a p-GaN layer having a relatively small thickness, and it is also difficult to control its size. Additionally, since a roughened surface formed at the p-GaN layer has to be limited above an active layer, the depth may not be larger than entire depths of the second conductivity type semiconductor layer 160 and the electron blocking layer 150. In addition, if a roughened surface is formed by etching a surface of the second conductivity type semiconductor layer 160, the distance between the electrode formed on the surface and the active layer is shortened and thereby current spreading is difficult to happen, and thus it is particularly vulnerable to electrostatic discharge, and the like. However, in the case of using V-pits, by utilizing relatively high resistance characteristics within V-pits, it is possible to provide the second conductive type semiconductor layer 160 advantageous for current spreading and also strong in resistance to electrostatic discharge. Furthermore, since it is unnecessary to separately perform a step for forming a roughened surface, a process for enhancing a light extraction efficiency is simplified.

Various modifications and changes can be made in the exemplary embodiments described herein without departing from the technical spirit according to the appended claims of the present disclosure, and the present disclosure comprises all the technical ideas according to the appended claims.

The invention claimed is:

1. A long wavelength light emitting device, comprising:
a first conductivity type semiconductor layer;
an active layer disposed on the first conductivity type semiconductor layer, the active layer having a quantum well structure;
an electron blocking layer disposed on the active layer and including Indium (In) with a first concentration; and
a second conductivity type semiconductor layer disposed on the electron blocking layer,
wherein the active layer comprises:
a well layer comprising a nitride-based semiconductor containing In with a second concentration that is more than or equal to 21%;
a barrier layer disposed under the well layer;
an uppermost barrier layer disposed over the well layer and under the electron blocking layer and including a sub barrier layer that has a bandgap energy smaller than an average bandgap energy of the uppermost barrier layer and contains In with a third concentration;
an upper capping layer disposed between the well layer and the uppermost barrier layer,
wherein the upper capping layer has a larger band gap energy than a band gap energy of the barrier layer and the average bandgap energy of the uppermost barrier layer, and
wherein the upper capping layer and the well layer contact with each other, and
wherein the second concentration is greater than the third concentration that is greater than the first concentration.

2. The long wavelength light emitting device according to claim 1, wherein the well layer comprises InGaN, the barrier layer comprises GaN, and the upper capping layer comprises AlGaN.

3. The long wavelength light emitting device according to claim 2, wherein AlGaN of the upper capping layer comprises 0.1% to 2.5% of Al.

4. The long wavelength light emitting device according to claim 1, wherein a thickness of the upper capping layer is smaller than that of the barrier layer.

5. The long wavelength light emitting device according to claim 1,
wherein a thickness of the uppermost barrier layer is larger than a thickness of the barrier layer.

6. The long wavelength light emitting device according to claim 1, further comprising:
a lower capping layer disposed between the well layer and the barrier layer,
wherein the lower capping layer has larger band gap energy than that of the barrier layer.

7. The long wavelength light emitting device according to claim 1,
wherein the electron blocking layer comprises a grading layer in which an Al composition ratio decreases toward the second conductivity type semiconductor layer.

8. The long wavelength light emitting device according to claim 1,
wherein the electron blocking layer comprises a first electron blocking layer in contact with the active layer, a second electron blocking layer disposed on the first electron blocking layer and a third electron blocking layer in contact with the second conductivity type semiconductor layer,
wherein the second electron blocking layer is doped with Mg at a higher concentration than the first and the third electron blocking layers, and
wherein the third electron blocking layer has a superlattice structure.

9. The long wavelength light emitting device according to claim 8, wherein the third electron blocking layer has a superlattice structure of AlInGaN/GaN.

10. The long wavelength light emitting device according to claim 1,
wherein the active layer comprises additional barrier layers that are located between the barrier layer and the first conductivity type semiconductor layer, and at least some of the barrier layer and the additional barrier layers are doped with an n-type impurity such that a doping concentration of the n-type impurity is relatively high as being closer to the first conductivity type semiconductor layer than the second conductivity type semiconductor layer.

11. The long wavelength light emitting device according to claim 1,
wherein the active layer comprises additional barrier layers that are located between the barrier layer and the first conductivity type semiconductor layer, and the barrier layer and the additional barrier layers are doped with Mg
such that a Mg doping concentration increases as being closer to the second conductivity type semiconductor layer.

12. The long wavelength light emitting device according to claim 1, wherein the first conductivity type semiconductor layer comprises a V-pit generating layer, and wherein the V-pit generating layer comprises a first layer of a single composition doped with an n-type impurity and a second layer of a superlattice structure.

13. The long wavelength light emitting device according to claim 12, wherein the first layer is a GaN layer doped with an n-type impurity, and the second layer has an InGaN/GaN superlattice structure.

14. The long wavelength light emitting device according to claim 13, wherein the V-pit generating layer has a thickness of 1500 Å to 3000 Å, and the thickness of the second layer of the superlattice structure is larger than or equal to that of the first layer of the single composition.

15. The long wavelength light emitting device according to claim 14, wherein the first conductivity type semiconductor layer further comprises a modulation doped layer with n-type impurity disposed under the V-pit generating layer, and
wherein a doping concentration of the modulation doped layer is higher than that of an n type impurity doping layer of the first layer.

16. The long wavelength light emitting device according to claim 12, wherein the second layer is doped with an n-type impurity at a larger concentration than that of the first layer.

17. The long wavelength light emitting device according to claim 12,
   wherein the active layer comprises an additional barrier layer doped with a higher concentration of an n-type impurity as compared to that of the barrier layer, the additional barrier layer disposed between the barrier layer and the first conductivity type semiconductor layer, and having higher doping concentration of an n-type impurity than that of the first layer.

18. The long wavelength light emitting device according to claim 1, further comprising:
   V-pits having entrances with a width exceeding 250 nm.

19. The long wavelength light emitting device according to claim 1,
   wherein the second conductivity type semiconductor layer comprises a p-AlGaN layer disposed between the p-GaN layers.

20. The long wavelength light emitting device according to claim 19,
   wherein the p-AlGaN layer is disposed closer to a lower surface of the second conductivity type semiconductor layer than an upper surface of the second conductivity type semiconductor layer, and
   wherein the lower surface is disposed closer to the active layer than the upper surface.

\* \* \* \* \*